(12) United States Patent
Lee et al.

(10) Patent No.: US 10,903,451 B2
(45) Date of Patent: Jan. 26, 2021

(54) ORGANIC LIGHT-EMITTING DISPLAY DEVICE AND MANUFACTURING METHOD THEREOF

(71) Applicant: LG DISPLAY CO., LTD., Seoul (KR)

(72) Inventors: Jaesung Lee, Paju-si (KR); Jonghyeok Im, Paju-si (KR); Dohyung Kim, Paju-si (KR); Seungwon Yoo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/225,174

(22) Filed: Dec. 19, 2018

(65) Prior Publication Data
US 2019/0198812 A1    Jun. 27, 2019

(30) Foreign Application Priority Data
Dec. 22, 2017  (KR) .................. 10-2017-0178563

(51) Int. Cl.
| | | |
|---|---|---|
| H01L 51/52 | (2006.01) | |
| H01L 27/32 | (2006.01) | |
| G09G 3/3233 | (2016.01) | |
| H01L 51/00 | (2006.01) | |
| H01L 51/50 | (2006.01) | |
| H01L 51/56 | (2006.01) | |
| G09G 3/3225 | (2016.01) | |

(52) U.S. Cl.
CPC ....... *H01L 51/5256* (2013.01); *G09G 3/3225* (2013.01); *G09G 3/3233* (2013.01); *H01L 27/3246* (2013.01); *H01L 51/0005* (2013.01); *H01L 51/5012* (2013.01); *H01L 51/5212* (2013.01); *H01L 51/5218* (2013.01); *H01L 51/5228* (2013.01); *H01L 51/56* (2013.01); *G09G 2300/0426* (2013.01); *G09G 2310/08* (2013.01)

(58) Field of Classification Search
CPC ............. H01L 27/3246; H01L 51/5253; H01L 51/5256
See application file for complete search history.

(56) References Cited

U.S. PATENT DOCUMENTS

| | | | |
|---|---|---|---|
| 2005/0053719 A1* | 3/2005 | Ishida | ................. H01L 51/5256 427/66 |
| 2014/0131683 A1* | 5/2014 | Kim | .................... H01L 51/5253 257/40 |
| 2016/0268540 A1* | 9/2016 | Kim | .................... H01L 51/5246 |
| 2016/0351851 A1* | 12/2016 | Lee | ..................... H01L 51/5253 |
| 2017/0069871 A1* | 3/2017 | Yim | .................... H01L 51/5253 |
| 2019/0058020 A1* | 2/2019 | Tsai | ...................... G06F 3/0412 |

FOREIGN PATENT DOCUMENTS

KR   10-2017-0080343 A   1/2017

* cited by examiner

*Primary Examiner* — David C Spalla
(74) *Attorney, Agent, or Firm* — Birch, Stewart, Kolasch & Birch, LLP

(57) ABSTRACT

An organic light-emitting display device can include a first passivation layer that covers a first area of a substrate and a second area adjacent to the first area, an organic light-emitting diode that lies on the first passivation layer in the first area of the substrate, and a protective layer that covers the organic light-emitting diode and is located in the first area of the substrate.

20 Claims, 4 Drawing Sheets

ORGANIC LIGHT-EMITTING DISPLAY DEVICE AND MANUFACTURING METHOD THEREOF

CROSS-REFERENCE TO RELATED APPLICATION

This application claims the priority benefit of Korean Patent Application No. 10-2017-0178563, filed on Dec. 22, 2017 in the Republic of Korea, which is incorporated herein by reference for all purposes as if fully set forth herein.

BACKGROUND OF THE INVENTION

Field of the Invention

The present invention relates to an organic light-emitting display device and a manufacturing method thereof.

Related Art

Organic light-emitting displays, which are a type of flat panel displays, are self-luminous displays that emit light through excitation of organic compounds. In contrast to liquid crystal displays (LCDs), the organic light-emitting displays work without a backlight; thus, the organic light-emitting displays can be lighter and thinner and made in a simplified process. Also, the organic light emitting displays are widely used because they can be manufactured at low temperatures, have a fast response time of 1 ms or less, and feature low power consumption, wide viewing angle, and high contrast.

The field of application for the display devices is becoming more and more diverse. For example, the display devices can be used as transparent displays by forming some area of the display panel as a transparent portion through which light can pass. Moreover, the display devices are often used in fields, such as curved displays, where the display panel remains curved or needs to be curved. With the diversification of devices in which displays are used, the displays need more improvements.

SUMMARY OF THE INVENTION

An example of the present invention provides an organic light-emitting display device which addresses the limitations and disadvantages associated with the related art.

An example embodiment of the present invention provides an organic light-emitting display device comprising a first passivation layer that covers a first area of a substrate and a second area adjacent to the first area, an organic light-emitting diode that lies on the first passivation layer in the first area of the substrate, and a protective layer that covers the organic light-emitting diode and is located in the first area of the substrate.

Another example embodiment of the present invention provides a manufacturing method for an organic light-emitting display device, the method comprising forming a first passivation layer to cover a substrate including a first area and a second area adjacent to the first area, forming an organic light-emitting diode on the first passivation layer in the first area of the substrate, and forming a protective layer to cover the organic light-emitting diode.

BRIEF DESCRIPTION OF THE DRAWINGS

The accompany drawings, which are included to provide a further understanding of the invention and are incorporated on and constitute a part of this specification, illustrate embodiments of the invention and together with the description serve to explain the principles of the invention. In the drawings.

DESCRIPTION OF THE EMBODIMENTS

Figure 1:
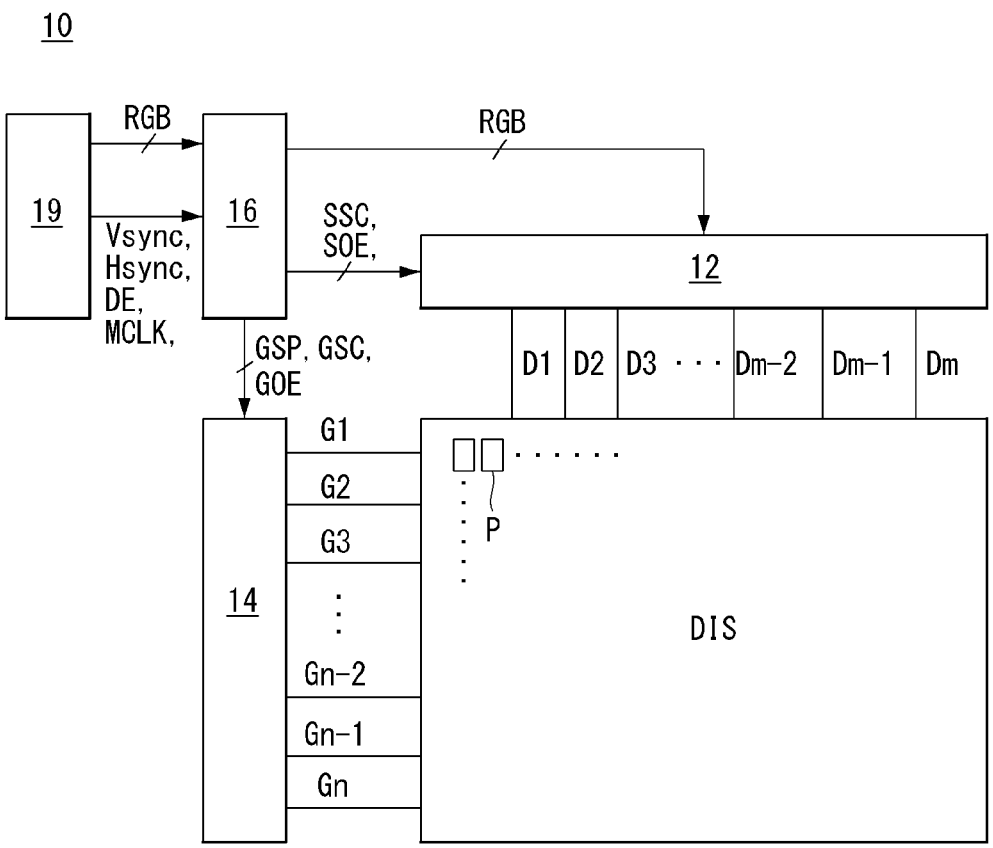
FIG. 1 is a view showing a display device according to an embodiment of the present invention.

Hereinafter, exemplary embodiments of the present invention will be described in detail with reference to the attached drawings. Throughout the specification, like reference numerals denote substantially like components. In describing the present invention, a detailed description of known functions or configurations related to the present invention will be omitted when it is deemed that they can unnecessarily obscure the subject matter of the present invention. In describing various exemplary embodiments, descriptions of the same or like components will be given in the beginning but omitted in other exemplary embodiments.

Figure 2:
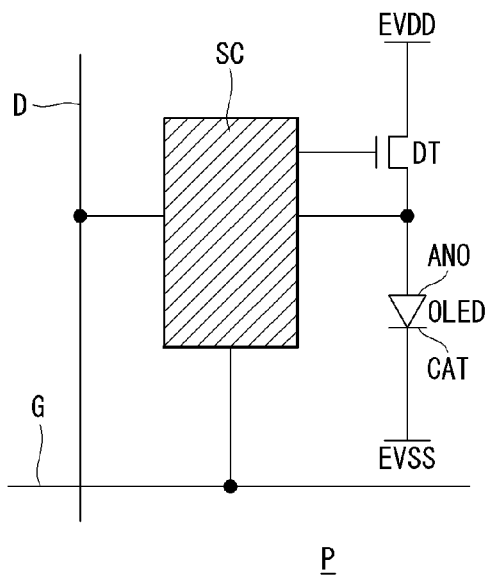
FIG. 2 is a view schematically showing an example of a pixel in FIG. 1.

FIG. 1 is a block diagram schematically showing an organic light-emitting display device according to an embodiment of the present invention. FIG. 2 is a view schematically showing the configuration of a pixel of FIG. 1. All the components of the organic light-emitting display devices according to all embodiments of the present invention are operatively coupled and configured.

Referring to FIGS. 1 and 2, an organic light-emitting display device 10 according to the present invention comprises a display drive circuit and a display panel DIS.

The display drive circuit comprises a data drive circuit 12, a gate drive circuit 14, and a timing controller 16, and writes a video data voltage of an input image to the pixels on the display panel DIS. The data drive circuit 12 converts digital video data RGB received from the timing controller 16 to an analog gamma-compensated voltage and generates a data voltage. The data voltage outputted from the data drive circuit 12 is supplied to data lines D1 to Dm, where m is a positive integer. The gate drive circuit 14 sequentially supplies a gate signal synchronized with the data voltage to gate lines GI to Gn and selects pixels from the display panel DIS to write the data voltage, where n is a positive integer.

The timing controller 16 receives timing signals such as a vertical synchronization signal Vsync, a horizontal synchronization signal Hsync, a data enable signal DE, a main clock MCLK, etc. from a host system 19, and synchronizes the operation timings of the data drive circuit 12 and gate drive circuit 14. Data timing control signals for controlling the data drive circuit 12 comprise a source sampling clock SSC, a source output enable signal SOE, etc. Gate timing control signals for controlling the gate drive circuit 14 comprise a gate start pulse GSP, a gate shift clock GSC, a gate output enable signal GOE, etc.

The host system 19 can be implemented as any one of the following: a television system, a set-top box, a navigation system, a DVD player, a Blue-ray player, a personal computer PC, a home theater system, a phone system (e.g., a smart phone), a smart watch, or any device/system used in connection with a display. The host system 19 comprises a system-on-chip (SoC) with a scaler embedded in it, and converts digital video data RGB of an input image into a format suitable for display on the display panel DIS. The host system 19 transmits the timing signals Vsync, Hsync, DE, and MCLK, along with the digital video data, to the timing controller 16.

The display panel DIS comprises a pixel array. The pixel array comprises pixels P that are defined by the data lines D1 to Dm (m is a positive integer) and the gate lines G1 to Gn (n is a positive integer). Each pixel P comprises an organic light-emitting diode which is a self-luminous element.

As shown in FIG. 2, each pixel P is connected to a data line D and a gate line G. Each pixel P comprises an organic light-emitting diode OLED, a driving transistor DT that controls the amount of current flowing in the organic light-emitting diode OLED, and a programming part SC that controls the operation of the driving transistor DT. The programming part SC is composed of one or more transistors and one or more capacitors, and controls voltages of primary nodes, for example, the gate and source electrodes of the driving transistor DT. In an example, the programming part SC writes a data voltage received from a data line D, in response to a gate pulse applied form a gate line G. The driving transistor DT supplies a drive current proportional to the amount of data voltage written to the programing part SC to the organic light-emitting diode OLED. The organic light-emitting diode OLED emits light in proportion to the amount of drive current supplied from the driving transistor DT. The organic light-emitting diode OLED comprises an anode ANO, a cathode CAT, and an organic compound layer interposed between the anode ANO and cathode CAT. The anode ANO is connected to the driving transistor DT.

Figure 3:
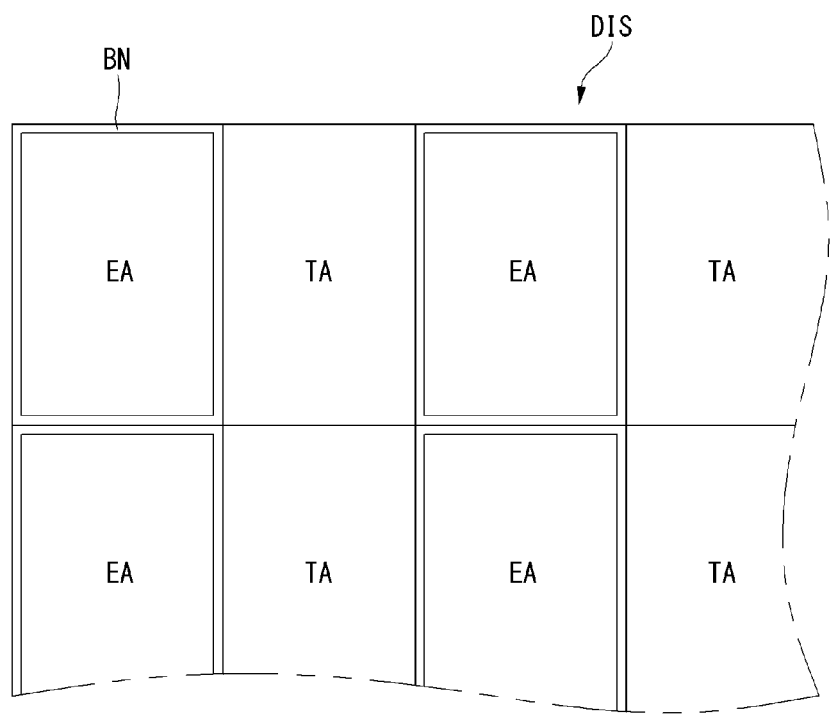
FIG. 3 is a view schematically showing an array area of a display panel according to an embodiment of the present invention.
Figure 4:
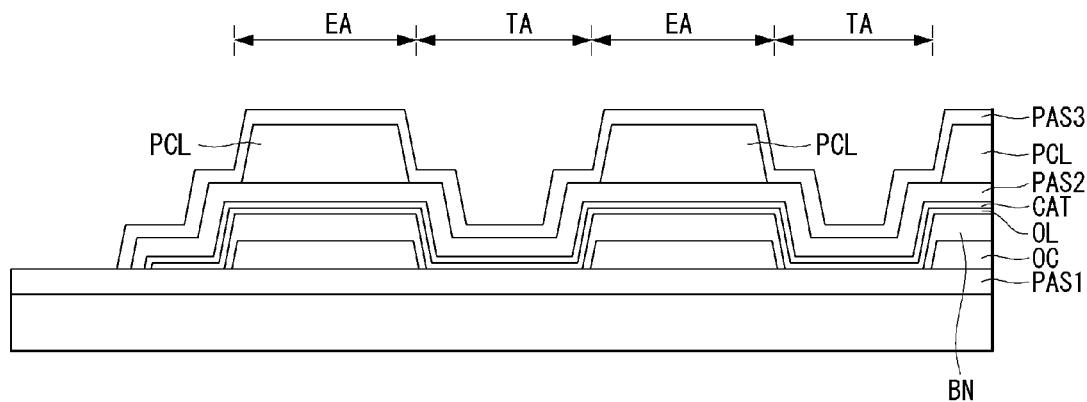
FIGS. 4 and 5 are views showing a cross-section of a display device according to an embodiment of the present invention.

FIG. 3 is a view showing a planar structure of a display panel according to an embodiment of the present invention. FIG. 4 is a view showing a cross-section of the display panel of FIG. 4 according to the embodiment of the present invention.

Referring to FIGS. 3 and 4, the display panel DIS comprises a transmitting area TA that lets light pass through and becomes transparent and a light-emitting area EA that displays an image.

The transmitting area TA functions as a transparent substrate by allowing light to pass through, and it is preferable that no opaque metal layer be located in the transmitting area TA, in order to increase transmissivity. One or more pixels P are located in the light-emitting area EA, and brightness is represented by using the light emitted from the organic light-emitting diodes OLED of the pixels P. The light-emitting area EA comprises a protective layer for protecting the pixels P. The protective layer can be a combination of a plurality of inorganic and organic layers. FIG. 4 depicts a protective layer comprising a second passivation layer PAS2, a cover layer PCL, and a third passivation layer PAS3 that covers the light-emitting area EA.

The light-emitting area EA and the transmitting area TA can alternate along rows and columns and be arranged in a checkerboard pattern.

Figure 5:
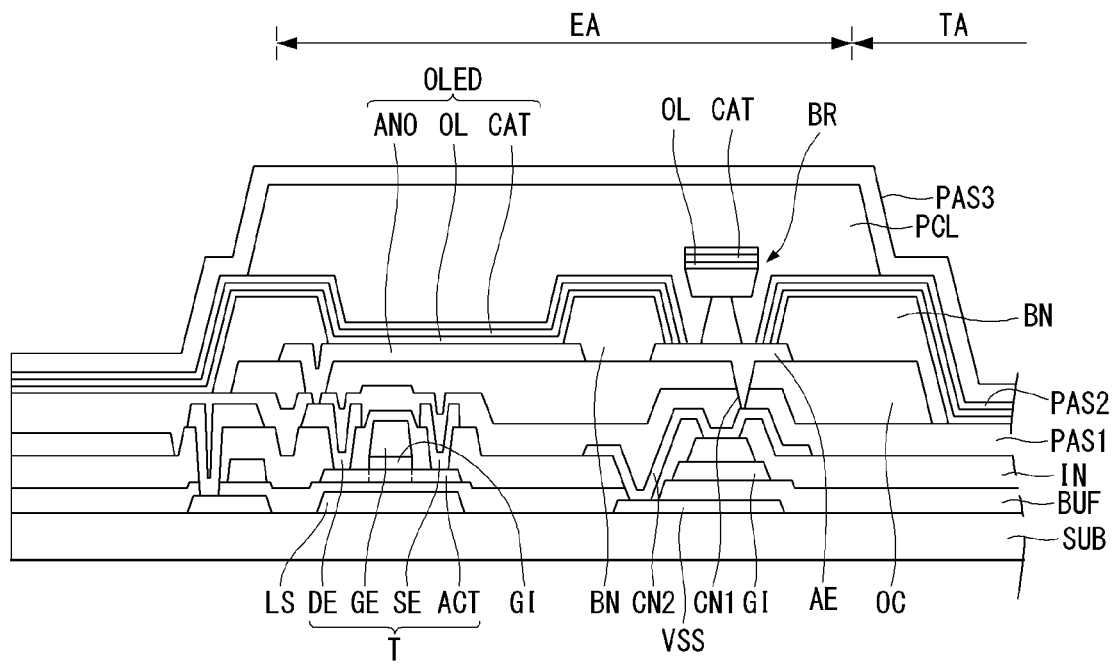

FIG. 5 is a view showing in detail the cross-sectional structure of FIG. 4.

Referring to FIG. 5, the organic light-emitting display device according to the present invention comprises transistors T formed on a substrate SUB and organic light-emitting diodes OLED.

The substrate SUB can be made of a glass or plastic material. For example, the substrate SUB can be made of a plastic material such as PI (polyimide), PET (polyethylene terephthalate), PEN (polyethylene naphthalate), and PC (polycarbonate), and can have flexibility.

A light blocking layer LS and a low-level voltage line VSS are located on the substrate SUB. The light blocking layer LS is disposed to overlap with a semiconductor layer, particularly, channel, of the transistor T on the plane, and serves to protect oxide semiconductor devices from external light.

A buffer layer BUF is located on the substrate SUB to cover the light blocking layer LS and the low-level voltage line VSS. The buffer layer BUF serves to block ions or impurities diffused from the substrate SUB and prevent external moisture penetration.

A semiconductor layer ACT is located on the buffer layer BUF. An insulating layer formed on the buffer layer BUF to cover the semiconductor layer ACT is patterned so that a gate insulating layer GI is located where a gate electrode GE is formed.

The gate insulating layer GI is for insulating the gate electrode GE, and can be made of a silicon oxide layer SiOx.

The gate electrode GE is located on the gate insulating layer GI.

The gate electrode GE is disposed to face the semiconductor layer ACT, with the gate insulating layer GI in between. The gate electrode GE can be composed of a single layer or multilayers made of any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W), or a combination thereof.

An interlayer insulating layer IN is disposed on the buffer layer BUF to cover the gate electrode GE. The interlayer insulating layer IN is for insulating the gate electrode GE and the source and drain electrodes SE and DE, and can be composed of a silicon oxide layer (SiOx), a silicon nitride layer (SiNx), or multiple layers thereof.

The source and drain electrodes SE and DE and a second auxiliary connecting portion CN2 are located over the interlayer insulating layer IN.

The source electrode SE and the drain electrode DE are spaced a predetermined distance apart. The source electrode SE comes into contact with one side of the semiconductor layer ACT via a source contact hole formed through the interlayer insulating layer IN. The drain electrode DE comes into contact with the other side of the semiconductor layer ACT via a drain contact hole formed through the interlayer insulating layer IN. The source electrode SE and the drain electrode DE can consist of a single layer or multiple layers. If the source electrode SE and the drain electrode DE consist of a single layer, they can be made of any one selected from the group consisting of molybdenum (Mo), aluminum (Al), chrome (Cr), gold (Au), titanium (Ti), nickel (Ni), neodymium (Nd), copper (Cu), or a combination thereof. If the source electrode SE and the drain electrode DE consist of multiple layers, they can be composed of two layers of molybdenum/aluminum-neodymium, molybdenum/aluminum, molybdenum/aluminium, titanium/aluminum, or copper/molytitanium, or three layers of molybdenum/aluminum-neodymium/molybdenum, molybdenum/aluminum/molybdenum, titanium/aluminum/titanium, or molytitanium/copper/molytitanium.

The first auxiliary connecting portion CN1 is formed through the interlayer insulating layer IN and connected to the first auxiliary connecting portion CN2. Also, the second auxiliary connecting portion CN2 is formed through the buffer layer BUF and the interlayer insulating layer IN and connected to the low-level voltage line VSS.

The semiconductor layer ACT, gate electrode GE, and source and drain electrodes SE and DE constitute the transistor T.

A first passivation layer PAS1 lies over the transistor T. The first passivation layer PAS1 is for protecting the transistor T, and can be composed of a silicon oxide layer (SiOx), a silicon nitride layer (SiNx), or multiple layers thereof.

A planarization layer OC lies on the first passivation layer PAS1. The planarization layer OC is for evening out the differences in level in the underlying structure, and can be made of an organic material such as photoacryl, polyimide, benzocyclobutene resin, or acrylate resin. If necessary, either the first passivation layer PAS1 or the planarization layer OC may be omitted.

The anode ANO and an auxiliary electrode AE are located on the planarization layer OC.

The anode ANO is connected to the drain electrode DE of the transistor T via a contact hole formed through the first passivation layer PAS1 and the planarization layer OC. The anode ANO consists of multiple layers comprising a reflective layer and can function as a reflective electrode. The reflective layer can be made of aluminum (Al), copper (Cu), silver (Ag), nickel (Ni), molytitanium (MoTi), etc.

The auxiliary electrode AE can be made of the same material on the same layer as the anode ANO. In this case, there is no need to perform a separate process for forming the auxiliary electrode AE, thereby reducing the manufacturing time and costs.

A bank layer BN defining the light-emitting area EA of the pixel P lies on the substrate where the anode ANO and the auxiliary electrode AE are formed. The bank layer BN can be made of an organic material such as polyimide, benzocyclobutene resin, or acrylate resin.

The bank layer BN can be disposed to expose the center of the anode ANO and cover the side edge of the anode ANO. It is desirable that the anode ANO is designed to have as large an exposed area as possible, so as to secure a sufficiently high aperture ratio. Moreover, the bank layer BN can be disposed to expose the center of the auxiliary electrode AE and cover the side of the auxiliary electrode AE.

The planarization layer OC and the bank layer BN are not located in the transmitting area TA, in order to prevent a yellowish phenomenon which occurs in the transmitting area TA. The yellowish phenomenon refers to a phenomenon in which a yellowish discoloration appears due to the material properties of the planarization layer OC and the bank layer BN.

Moreover, the bank layer BN is formed to cover the side of the planarization layer OC, in order to prevent outgassing from the planarization layer OC. Outgassing refers to a phenomenon in which impurities from the planarization layer OC, which is an organic material, are gasified and released in the process of driving the organic light-emitting display device. Due to the structure in which the bank layer BN is formed to cover the side of the planarization layer OC, the bottom edge of the bank layer BN is located on the first passivation layer PAS1.

A barrier BR is located on the auxiliary electrode AE. The barrier BR functions to physically separate the organic emissive layer OL, cathode CAT, and second passivation layer PAS2 to be formed later. In other words, the organic emissive layer OL, cathode CAT, and second passivation layer PAS2 on the auxiliary electrode AE can be physically separated by the barrier BR and become discontinuous.

The organic emissive layer OL lies over the substrate SUB where the barrier BR is formed. The organic emissive layer OL can be formed across the entire surface of the substrate SUB.

The organic emissive layer OL on the auxiliary electrode AE is physically separated by the barrier BR. The organic emissive layer OL is separated by the barrier BR and exposes at least part of the auxiliary electrode AE in the neighboring region of the barrier BR. Part of the organic emissive layer OL separated by the barrier BR lies on top of the barrier BR.

The cathode CAT lies over the organic emissive layer OL. The cathode CAT can be formed widely across the entire surface of the substrate SUB. The cathode CAT can be formed of a transparent conductive material such as ITO (indium tin oxide) or IZO (indium zinc oxide), and can be made of magnesium (Mg), calcium (Ca), aluminum (Al), silver (Ag), or an alloy thereof that is made thin enough to allow light to pass through.

The cathode CAT on the auxiliary electrode AE is physically separated by the barrier BR. The cathode CAT is separated by the barrier BR and exposes at least part of the auxiliary electrode AE in the neighboring region of the barrier BR. Part of the cathode CAT separated by the barrier BR lies on top of the barrier BR.

The cathode CAT is formed to cover the organic emissive layer OL, with one end making direct contact with the auxiliary electrode AE. That is, one end of the cathode CAT separated by the barrier BR and exposed makes direct contact with the exposed top surface of the auxiliary electrode AE. Such a structure can be implemented by the difference in step coverage between the materials of the organic emissive layer OL and cathode CAT. For example, the cathode CAT can make direct contact with the auxiliary electrode AE since it can be made of a transparent conductive material that has higher step coverage than the material of the organic emissive layer OL.

A protective layer PAS2, PCL, and PAS3 is formed over the organic light-emitting diode OLED comprising the anode ANO, organic emissive layer OL, and cathode CAT. The protective layer PAS2, PCL, and PAS3 comprises the second passivation layer PAS2, the cover layer PCL, and the third passivation layer PAS3.

The second passivation layer PAS2 lies on the cathode CAT. The second passivation layer PAS2 can be formed widely across the entire surface of the first substrate SUB1. The second passivation layer PAS2 can be made of the same material as the silicon oxide layer (SiOx) or silicon nitride layer (SiNx).

The second passivation layer PAS2 can lie on the cathode CAT and prevent impurities from entering the organic light-emitting diode OLED. For example, the cathode CAT comprising a transparent conductive material is crystalline and therefore is not able to prevent ion and moisture penetration, thereby allowing external impurities from passing through the cathode CAT and entering the organic emissive layer OL. In the present invention, the second passivation layer PAS2 is formed over the organic light-emitting diode OLED to prevent impurities from entering the organic light-emitting diode OLED. Hence, the present invention has the benefit of preventing or minimizing any decrease in the lifetime and brightness of the organic light-emitting diode OLED.

The second passivation layer PAS2 on the auxiliary electrode AE can be physically separated by the barrier BR. The second passivation layer PAS2 is separated by the barrier BR and exposes at least part of the auxiliary electrode AE in the neighboring region of the barrier BR. Part of the organic emissive layer OL separated by the barrier BR is located in the upper part of the barrier BR. Accordingly, part of the organic emissive layer OL, part of the cathode CAT, and part of the second passivation layer PAS2, which are separated by the barrier BR, are sequentially stacked on the barrier BR.

The cover layer PCL lies on the second passivation layer PAS2. The cover layer PCL can be made of an organic material such as photoacryl, polyimide, benzocyclobutene resin, acrylate resin, or epoxy resin.

The cover layer PCL is located in the light-emitting area EA but not in the transmitting area TA.

The third passivation layer PAS3 covers the cover layer PCL and lies on the second passivation layer PAS2. The third passivation layer PAS3 can consist of a silicon oxide layer (SiOx), a silicon nitride layer (SiNx), or multiple layers thereof.

In this way, the embodiments of the present invention can improve durability by forming a protective layer composed of an inorganic layer and an organic layer in the area where the organic light-emitting diode OLED is located.

Notably, in the display panel of the embodiments of the present invention, the cover layer PCL is not located in the transmitting area TA, thus causing the second passivation layer PAS2 and third passivation layer PAS3 in the transmitting area TA to make direct contact with each other. Since the transmitting area TA is made thinner compared to the light-emitting area EA, the display panel DIS becomes more flexible due to the difference in thickness between the light-emitting area EA and the transmitting area TA. The display panel of the embodiments of the present invention is advantageous for curved display or flexible display applications because it has high durability for bendable designs.

The cover layers PCL in different light-emitting areas EA are separated from one another by the third passivation layer PAS3. Thus, even if moisture penetrates one of the light-emitting areas EA, it does not spread into the other light-emitting areas EA. As a result, the effect of moisture penetration on the reliability of the entire display panel DIS can be reduced.

Moreover, the display panel DIS according to the embodiments of the present invention can increase the transmissivity of the transmitting area TA because the transmitting area TA is thin.

Figure 6:
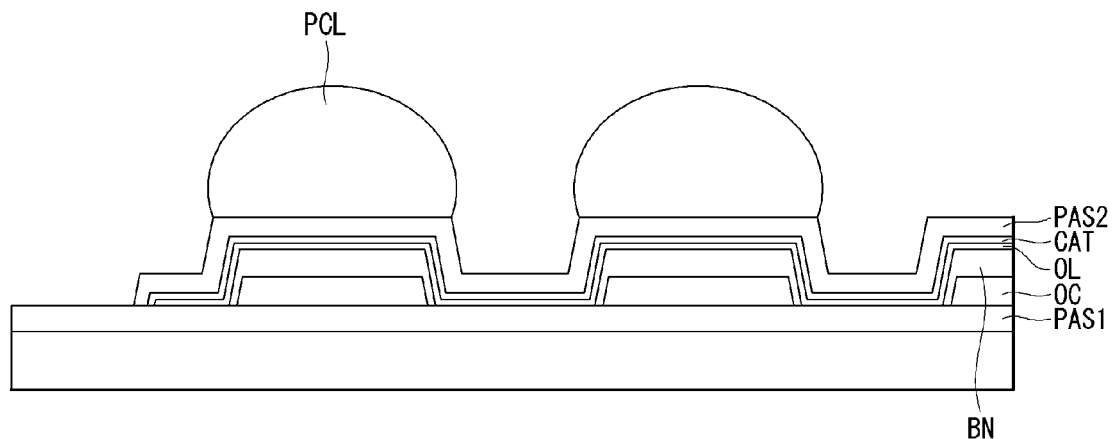
FIGS. 6 and 7 are views illustrating a manufacturing method of a display device according to an embodiment of the present invention.
Figure 7:
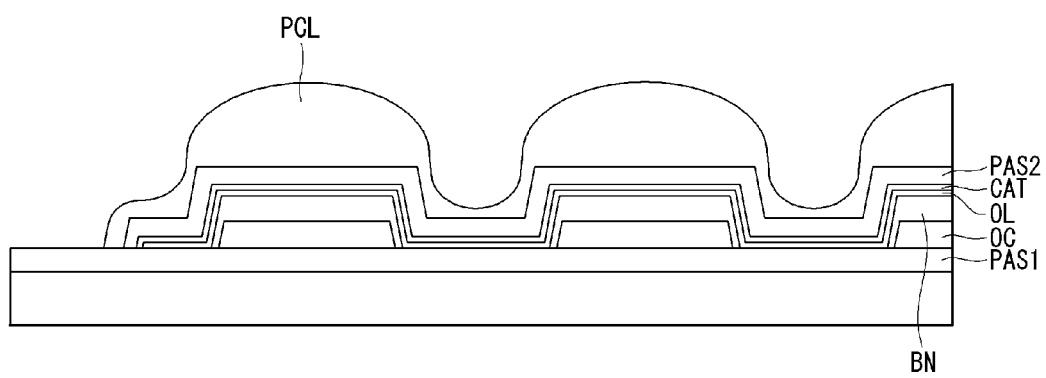

FIGS. 6 and 7 are views illustrating a method of forming a protective layer according to an embodiment of the present invention.

Referring to FIG. 6, the planarization layer OC and the bank layer BN are sequentially formed on the first passivation layer PAS1. The anode ANO of FIG. 5 can be formed before the bank layer BN is formed. After the bank layer BN is formed, the organic emissive layer OL and the cathode CAT are sequentially formed. Next, the second passivation layer PAS2 is formed on the entire surface of the substrate SUB to cover the organic light-emitting diode OLED comprising the anode ANO, organic emissive layer OL, and cathode CAT.

Subsequently, the light-emitting area EA is coated with the cover layer PCL. By coating the cover layer PCL by an inkjet printing method while the first passivation layer PAS1 is present, the light-emitting area EA is coated with the cover layer PCL as shown in FIG. 6, due to the difference in level between the light-emitting area EA and the transmitting area TA.

Referring to FIG. 7, the cover layer PCL is located mainly in the light-emitting area EA, but some part of it spreads due to the material properties. Next, the third passivation layer PAS3 of FIGS. 4 and 5 is formed to cover the cover layer PCL.

After the cover layer PCL is formed, the organic material that forms the cover layer PCL can be left in the transmitting area TA because the cover layer PCL spreads in the process of forming the third passivation layer PAS3. A small amount of cover layer material left in the transmitting area TA can be removed by dry etching. Even with the small amount of cover layer material left in the transmitting area TA, the second passivation layer PAS2 and the third passivation layer PAS3 can be joined together at the boundary between the light-emitting area EA and the transmitting area TA, so the cover layer PCL in the light-emitting area EA can be physically isolated enough. Thus, the process of etching the cover layer material left in the transmitting area TA may be omitted.

As discussed above, the embodiments of the present invention can improve durability by forming a protective layer composed of an inorganic layer and an organic layer in the area where the organic light-emitting diode OLED is located.

Notably, in the embodiments of the present invention, the flexibility caused by the difference in thickness between the light-emitting area and the transmitting area gives advantages for curved display or flexible display applications.

Additionally, the cover layers in different light-emitting areas are separated from one another, and this prevents moisture penetration in one light-emitting area from leading to moisture penetration across all areas of the display panel.

From the above-described details, those skilled in the art will appreciate that various changes and modifications are possible without departing from the technical spirit of the invention. Accordingly, the technical scope of the present invention is not limited to the detailed description of the specification, but should be defined by the accompanying claims.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light-emitting display device comprising:
   a first passivation layer that covers light-emitting areas and transmitting areas of a substrate, the transmitting areas being adjacent to the light-emitting areas, wherein the light-emitting areas and the transmitting areas alternate along rows and columns;
   organic light-emitting diodes that lie on the first passivation layer, one of the organic light-emitting diodes being disposed in each of the light-emitting areas of the substrate;
   barriers disposed on the first passivation layer, one of the barriers being disposed in each of the light-emitting areas; and
   a protective layer that covers the organic light-emitting diodes and the barriers, wherein the protective layer comprises:
a second passivation layer disposed in the light-emitting areas and the transmitting areas; and
a cover layer disposed on the second passivation layer in the light emitting areas, and
wherein the second passivation layer is physically separated by the barriers.

2. The organic light-emitting display device of claim 1, wherein the protective layer further comprises:
a third passivation layer that covers the cover layer.

3. The organic light-emitting display device of claim 2, wherein the cover layer is made of an organic material.

4. The organic light-emitting display device of claim 3, wherein the second and third passivation layers are made of an inorganic material.

5. The organic light-emitting display device of claim 2, wherein the second and third passivation layers are in contact with each other in the transmitting areas of the substrate.

6. The organic light-emitting display device of claim 1, further comprising:
a planarization layer that lies on the first passivation layer in the light-emitting areas of the substrate; and
a bank layer that defines the light-emitting areas and the transmitting areas of the substrate and lies on the planarization layer,
wherein the organic light-emitting diodes lie on the planarization layer.

7. The organic light-emitting display device of claim 1, wherein the transmitting areas of the substrate are a transmitting area that lets light pass through.

8. A manufacturing method for an organic light-emitting display device, the method comprising:
forming a first passivation layer to cover a substrate including light emitting areas and transmitting areas adjacent to the light-emitting areas, wherein the light-emitting areas and the transmitting areas alternate along rows and columns;
forming organic light-emitting diodes on the first passivation layer in the light-emitting areas of the substrate;
forming barriers on the first passivation layer, one of the barriers being disposed in each of the light-emitting areas; and
forming a protective layer to cover the organic light-emitting diodes,
wherein the forming the protective layer comprising:
forming a second passivation layer in the light-emitting areas and the transmitting areas; and
forming a cover layer on the second passivation layer in the light-emitting areas, and
wherein the second passivation layer is separated by the barriers.

9. The method of claim 8, wherein the forming of the protective layer further comprises:
forming a third passivation layer to cover the cover layer.

10. The method of claim 9, further comprising:
forming a planarization layer on the first passivation layer in the light-emitting areas of the substrate before the forming of the organic light-emitting diodes; and
forming a bank layer on the planarization layer to define the light-emitting areas and the transmitting areas of the substrate.

11. The method of claim 10, wherein, in the forming of the cover layer, the light-emitting areas of the substrate are coated with an inorganic material by inkjet printing.

12. The organic light-emitting display device of claim 6, wherein the planarization layer and the bank layer are not located in the transmitting areas of the substrate.

13. An organic light-emitting display device comprising:
a first passivation layer that covers a light-emitting area and a transmitting area of a substrate, the transmitting area being adjacent to the light-emitting area;
a planarization layer that lies on the first passivation layer in the light-emitting area of the substrate:
a bank layer that defines the light-emitting area and the transmitting area of the substrate and lies on the planarization layer;
an organic light-emitting diode that lies on the planarization layer in the light-emitting area of the substrate;
a barrier disposed on the first passivation layer; and
a protective layer that covers the organic light-emitting diode and the barrier,
wherein the protective layer comprises:
a second passivation layer disposed in the light-emitting area and the transmitting area; and
a cover layer disposed on the second passivation layer in the light-emitting area between two adjacent transmitting areas,
wherein the second passivation layer is physically separated by the barrier, and
wherein the bank layer is formed to cover a side of the planarization layer, and a bottom edge of the bank layer is located on the first passivation layer.

14. An organic light-emitting display device comprising:
a first passivation layer that covers a light-emitting area and a transmitting area of a substrate, the transmitting area being adjacent to the light-emitting area;
a planarization layer that lies on the first passivation layer in the light-emitting area of the substrate;
a bank layer that defines the light-emitting area and the transmitting area of the substrate and lies on the planarization layer;
an organic light-emitting diode that lies on the planarization layer in the light-emitting area of the substrate;
a barrier disposed on the first passivation layer; and
a protective layer that covers the organic light-emitting diode and the barrier,
wherein the protective layer comprises:
a second passivation layer disposed in the light-emitting area and the transmitting area; and
a cover layer disposed on the second passivation layer in the light-emitting area between two adjacent transmitting areas,
wherein the second passivation layer is physically separated by the barrier,
wherein an anode electrode connected to the organic light-emitting diode and an auxiliary electrode are located on the planarization layer, and
wherein the barrier is located on the auxiliary electrode.

15. The organic light-emitting display device of claim 14, wherein the second passivation layer is separated by the barrier and exposes at least part of the auxiliary electrode in a neighboring region of the barrier.

16. The organic light-emitting display device of claim 14, wherein the auxiliary electrode is made of a same material on a same layer as the anode electrode.

17. The organic light-emitting display device of claim 14, wherein the bank layer defining the light-emitting area lies on the substrate where the anode electrode and the auxiliary electrode are formed.

18. The organic light-emitting display device of claim 14, wherein the bank layer is disposed to expose a center of the auxiliary electrode and cover a side of the auxiliary electrode.

19. The organic light-emitting display device of claim 14, wherein an organic emissive layer, a cathode electrode, and the second passivation layer on the auxiliary electrode are physically separated by the barrier and become discontinuous.

20. The organic light-emitting display device of claim 19, wherein part of the organic emissive layer separated by the barrier lies on top of the barrier.

* * * * *